(12) United States Patent
Hirota et al.

(10) Patent No.: US 8,501,520 B2
(45) Date of Patent: Aug. 6, 2013

(54) MANUFACTURING METHOD FOR A SOLID-STATE IMAGE SENSOR

(75) Inventors: Katsunori Hirota, Yamato (JP); Akira Ohtani, Ebina (JP); Kazuaki Tashiro, Ebina (JP); Yusuke Onuki, Fujisawa (JP); Takanori Watanabe, Yamato (JP); Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 368 days.

(21) Appl. No.: 12/697,420

(22) Filed: Feb. 1, 2010

(65) Prior Publication Data

US 2010/0203667 A1  Aug. 12, 2010

(30) Foreign Application Priority Data

Feb. 6, 2009 (JP) ................. 2009-026697
Feb. 6, 2009 (JP) ................. 2009-026703
Jan. 21, 2010 (JP) ................. 2010-011372

(51) Int. Cl.
 *H01L 51/40* (2006.01)
(52) U.S. Cl.
 USPC .......... 438/72; 438/57; 438/75; 438/473; 257/292; 257/290; 257/443; 257/E27.133
(58) Field of Classification Search
 USPC .......... 257/E21.001, 233, E31.083, 290–292, 257/443–446, E27.133; 438/73, 75, 57–58, 438/473, 530
 See application file for complete search history.

(56) References Cited

U.S. PATENT DOCUMENTS

| | | | |
|---|---|---|---|
| 6,281,531 B1 | 8/2001 | Kamashita et al. | 257/258 |
| 6,423,993 B1 | 7/2002 | Suzuki et al. | 257/292 |
| 6,731,337 B2 | 5/2004 | Watanabe | 348/308 |
| 6,885,047 B2 | 4/2005 | Shinohara et al. | 257/292 |
| 7,323,731 B2 | 1/2008 | Yuzurihara et al. | 257/292 |

(Continued)

FOREIGN PATENT DOCUMENTS

| | | |
|---|---|---|
| CN | 1471311 | 1/2004 |
| CN | 1627524 | 6/2005 |

(Continued)

OTHER PUBLICATIONS

Office Action issued Dec. 24, 2012, in Chinese Patent Application No. 201080006217.3, with translation

(Continued)

*Primary Examiner* — Evan Pert
*Assistant Examiner* — Mark A Laurenzi
(74) *Attorney, Agent, or Firm* — Fitzpatrick, Cella, Harper & Scinto (57) ABSTRACT

A manufacturing method for a solid-state image sensor, the method comprises the steps of: forming a charge storage region in a photoelectric converting unit by implanting a semiconductor substrate with ions of an impurity of a first conductivity type, using a first mask; heating the semiconductor substrate at a temperature of no less than 800° C. and no more than 1200° C. through RTA (Rapid Thermal Annealing); forming a surface region of the charge storage region by implanting the semiconductor substrate with ions of an impurity of a second conductivity type, using a second a mask; heating the semiconductor substrate at a temperature of no less than 800° C. and no more than 1200° C. through RTA (Rapid Thermal Annealing); and forming an antireflection film that covers the photoelectric converting unit at a temperature of less than 800° C., after the step of forming the surface region, in this order.

7 Claims, 7 Drawing Sheets

(56) References Cited

U.S. PATENT DOCUMENTS

| | | | |
|---|---|---|---|
| 7,411,170 B2 | 8/2008 | Shimotsusa et al. | 250/208.1 |
| 7,456,880 B2 | 11/2008 | Okita et al. | 348/243 |
| 7,459,735 B2 | 12/2008 | Ezaki et al. | 257/292 |
| 7,473,948 B2 | 1/2009 | Yuzurihara et al. | 257/292 |
| 7,514,732 B2 | 4/2009 | Okita et al. | 257/292 |
| 7,679,116 B2 | 3/2010 | Yuzurihara et al. | 257/292 |
| 7,687,299 B2 | 3/2010 | Ichikawa | 438/57 |
| 7,732,246 B2 | 6/2010 | Lee | 438/74 |
| 7,776,643 B2 | 8/2010 | Nomura et al. | 438/79 |
| 7,920,192 B2 | 4/2011 | Watanabe et al. | 348/308 |
| 7,928,477 B2 | 4/2011 | Kobayashi et al. | 257/225 |
| 7,935,557 B2 | 5/2011 | Mishima et al. | 438/60 |
| 2002/0050593 A1 | 5/2002 | Fukunaga et al. | 257/53 |
| 2004/0188722 A1* | 9/2004 | Izumi et al. | 257/215 |
| 2005/0035382 A1 | 2/2005 | Shinohara et al. | 257/290 |
| 2005/0269604 A1 | 12/2005 | Koizumi et al. | 257/291 |
| 2006/0043519 A1 | 3/2006 | Ezaki | 257/461 |
| 2006/0076581 A1 | 4/2006 | Oda et al. | 257/215 |
| 2006/0138531 A1 | 6/2006 | Lee | 257/327 |
| 2007/0281472 A1* | 12/2007 | Press et al. | 438/664 |
| 2008/0038865 A1* | 2/2008 | Kwon | 438/73 |
| 2009/0050997 A1 | 2/2009 | Mutoh | 257/440 |
| 2009/0256230 A1 | 10/2009 | Watanabe | 257/435 |
| 2009/0284632 A1 | 11/2009 | Onuki et al. | 348/302 |
| 2010/0187581 A1 | 7/2010 | Shinohara et al. | 257/292 |
| 2010/0214464 A1 | 8/2010 | Watanabe | 348/311 |
| 2011/0032379 A1 | 2/2011 | Kobayashi et al. | 348/222.1 |
| 2011/0136291 A1 | 6/2011 | Iwata et al. | 438/73 |
| 2011/0157447 A1 | 6/2011 | Watanabe et al. | 348/308 |
| 2011/0171770 A1 | 7/2011 | Mishima et al. | 438/60 |

FOREIGN PATENT DOCUMENTS

| | | |
|---|---|---|
| CN | 1758442 | 4/2006 |
| CN | 1815744 | 8/2006 |
| CN | 1819236 | 8/2006 |
| CN | 101312205 | 11/2008 |
| CN | 101359675 | 2/2009 |
| EP | 1 542 286 A2 | 6/2005 |
| EP | 1 708 267 A1 | 10/2006 |
| EP | 1 995 783 A2 | 11/2008 |
| EP | 1995783 A2 | 11/2008 |
| EP | 1542286 | 12/2008 |
| JP | 11-126893 A | 5/1999 |
| JP | 2001-257339 A | 9/2001 |
| JP | 2004-193547 A | 7/2004 |
| JP | 2005-197674 A | 7/2005 |
| JP | 2006-024907 A | 1/2006 |
| JP | 2006-073609 A | 3/2006 |
| JP | 2008-060356 A | 3/2008 |
| WO | WO 2005/109512 A1 | 11/2005 |

OTHER PUBLICATIONS

Office Action issued on Jan. 14, 2013 in Chinese Patent Application No. 201080006232.8 (a counterpart of co-pending U.S. Appl. No. 13/131,442), with translation.

Office Action issued on Feb. 11, 2013 in co-pending U.S. Appl. No. 13/132,968.

* cited by examiner

MANUFACTURING METHOD FOR A SOLID-STATE IMAGE SENSOR

BACKGROUND OF THE INVENTION

1. Field of the Invention

The present invention relates to a manufacturing method for a solid-state image sensor.

2. Description of the Related Art

Patent Document 1 (Japanese Patent Laid-Open No. 11-126893) discloses a photodiode, for configuring a solid-state image sensor, that includes a P-type charge storage layer and an N-type depletion prevention layer disposed thereupon. In order to form the stated P-type charge storage layer, a P-type semiconductor substrate is first implanted with boron ions, and is then heat-treated at a temperature of 800-1000° C. for approximately 30 minutes in a nitrogen atmosphere. Meanwhile, in order to form the stated N-type depletion prevention layer, a P-type semiconductor substrate is first implanted with phosphorous ions, and is then heat-treated at a temperature of 800-1000° C. for approximately 30 minutes in a nitrogen atmosphere. Patent Document 1 discloses that Rapid Thermal Annealing (RTA) may be used in the heat treatments following the stated boron implantation and phosphorous implantation.

Patent Document 2 (Japanese Patent Laid-Open No. 2001-257339), meanwhile, discloses a manufacturing method for a solid-state image sensor in which an RTA process for activating impurities is performed after each step of impurity ion implantation is completed. In Patent Document 2, electrons are used as the carrier of the signal charge.

Patent Document 3 (Japanese Patent Laid-Open No. 2008-60356) discloses a solid-state image sensor in which an antireflection layer is disposed on the light-receiving surface of an embedded photodiode in which a first conductivity type semiconductor region and a second conductivity type semiconductor region are layered. The antireflection layer can be formed using a layered structure containing SiN and SiO.

When the charge storage region of a photodiode (PD) is formed through ion implantation, the following step of implanting ions of the opposite conductivity type in the surface region thereof causes crystal defects to occur in the surface region and the charge storage region.

If CVD is further used to form an antireflection film upon the PD surface, the semiconductor substrate is heated at a temperature of less than 800° C. for an extended period of time during the application of CVD; therefore, the impurity ions that form the surface region undergo enhanced diffusion due to interaction with the crystal defects within the surface region and the charge storage region. This phenomenon is known to appear dramatically at low temperatures. The reason for this is that the recovery rate of crystal defects is slower at low temperatures than at high temperatures, and thus the enhanced diffusion occurs for a longer amount of time.

It is necessary for the charge storage region of a solid-state image sensor to store at least a desired number of electrons or holes. If enhanced diffusion causes a high-concentration surface region to diffuse toward the interior of the semiconductor substrate, the concentration of the charge storage region will suddenly drop, causing an extreme decrease in the ability to store electrons or holes. In solid-state image sensors, such a decrease in ability causes the saturation characteristics to degrade.

Patent Document 1 discloses that the heat treatments following the implantation of boron or the implantation of phosphorous may, depending on the situation, be carried out through RTA, but does not disclose specific conditions for using RTA.

Meanwhile, although Patent Document 2 discloses performing an RTA process each time a step of implanting impurity ions of each conductivity type is completed, Patent Document 2 similarly does not disclose specific conditions for using RTA.

Furthermore, while increasing the concentration of the charge storage region at the time of ion implantation can be considered as a different measure with respect to the aforementioned abnormal diffusion, such a method causes an increase in the voltage applied to the gate of a MOS transistor adjacent to the PD when transferring the charge stored in the MOS transistor.

A rise in the voltage for charge transfer is fatal particularly in CMOS solid-state image sensors, which are driven at lower voltages than CCDs. Balancing low-voltage driving and sufficient saturation characteristics is an essential issue for CMOS solid-state image sensors, an issue that becomes even more important as pixel dimensions decrease.

SUMMARY OF THE INVENTION

It is therefore an object of the present invention to provide more specific manufacturing conditions with respect to RTA techniques in a manufacturing method for a solid-state image sensor, thus enabling a reduction in dark current through the recovery of crystal defects with a low heat load and the obtainment of a sufficient saturation load at low voltages by suppressing low-temperature enhanced diffusion.

In light of the above problems, the present invention provides a manufacturing method for a solid-state image sensor, the method including the steps of: forming a charge storage region in a photoelectric converting unit by implanting a semiconductor substrate with ions of an impurity of a first conductivity type, using a first mask; heating the semiconductor substrate at a temperature of no less than 800° C. and no more than 1200° C. through RTA (Rapid Thermal Annealing); forming a surface region of the charge storage region by implanting the semiconductor substrate with ions of an impurity of a second conductivity type, using a second mask; heating the semiconductor substrate at a temperature of no less than 800° C. and no more than 1200° C. through RTA (Rapid Thermal Annealing); and forming an antireflection film that covers the photoelectric converting unit at a temperature of less than 800° C., after the step of forming the surface region, in this order.

According to the present invention, specific RTA conditions for recovering crystal defects in a photodiode through a low heat load can be provided. According to this method, dark current in the photodiode can be reduced, and low-temperature enhanced diffusion in the surface region is suppressed; therefore, the charge storage layer can be formed in a shallower location in the semiconductor. It is thus possible to provide a solid-state image sensor having low dark current and favorable saturation characteristics at low voltages. This effect can be dramatically exploited in CMOS-type solid-state image sensors.

Further features of the present invention will become apparent from the following description of exemplary embodiments with reference to the attached drawings.

DESCRIPTION OF THE EMBODIMENTS

Figure 1A:
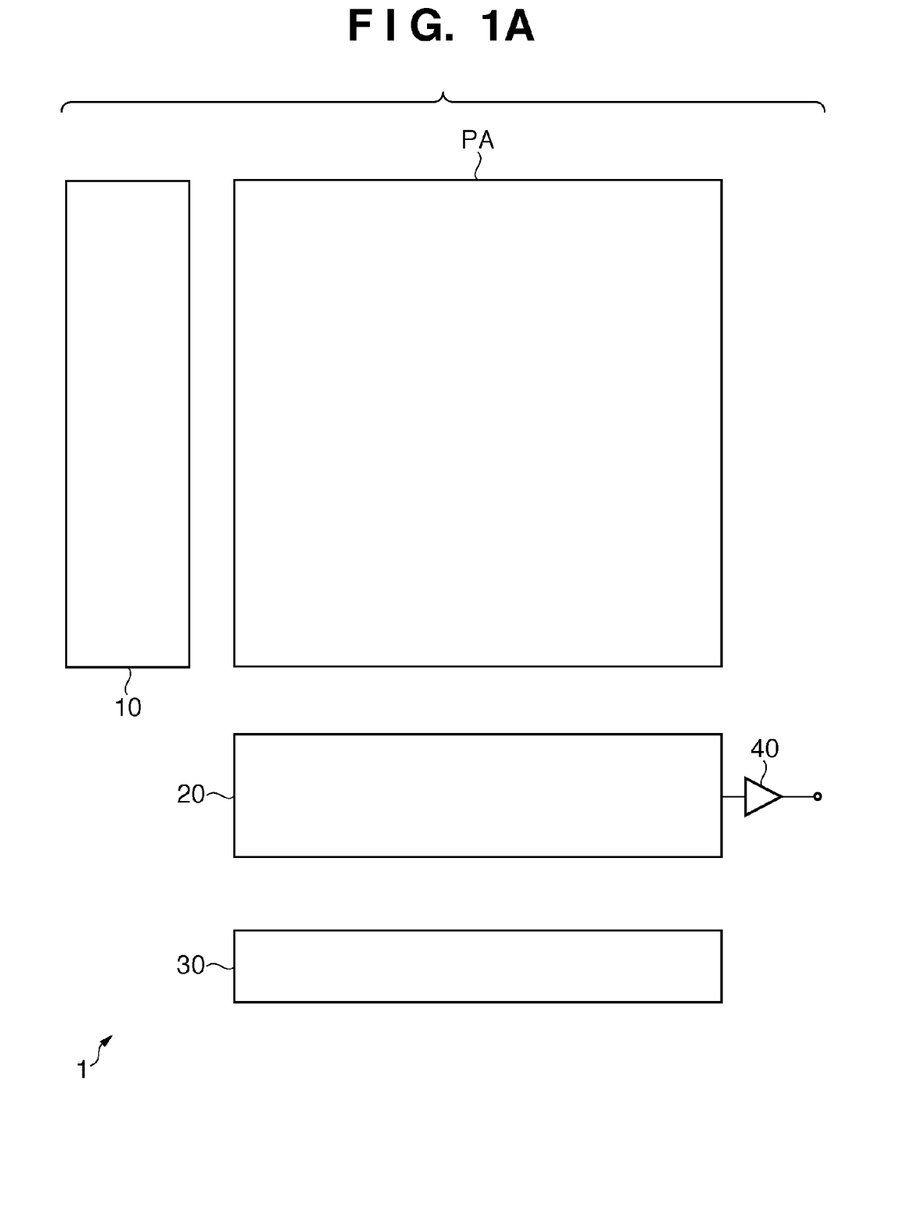
FIG. 1A is a diagram illustrating the overall configuration of a solid-state image sensor according to the present invention.
Figure 1B:
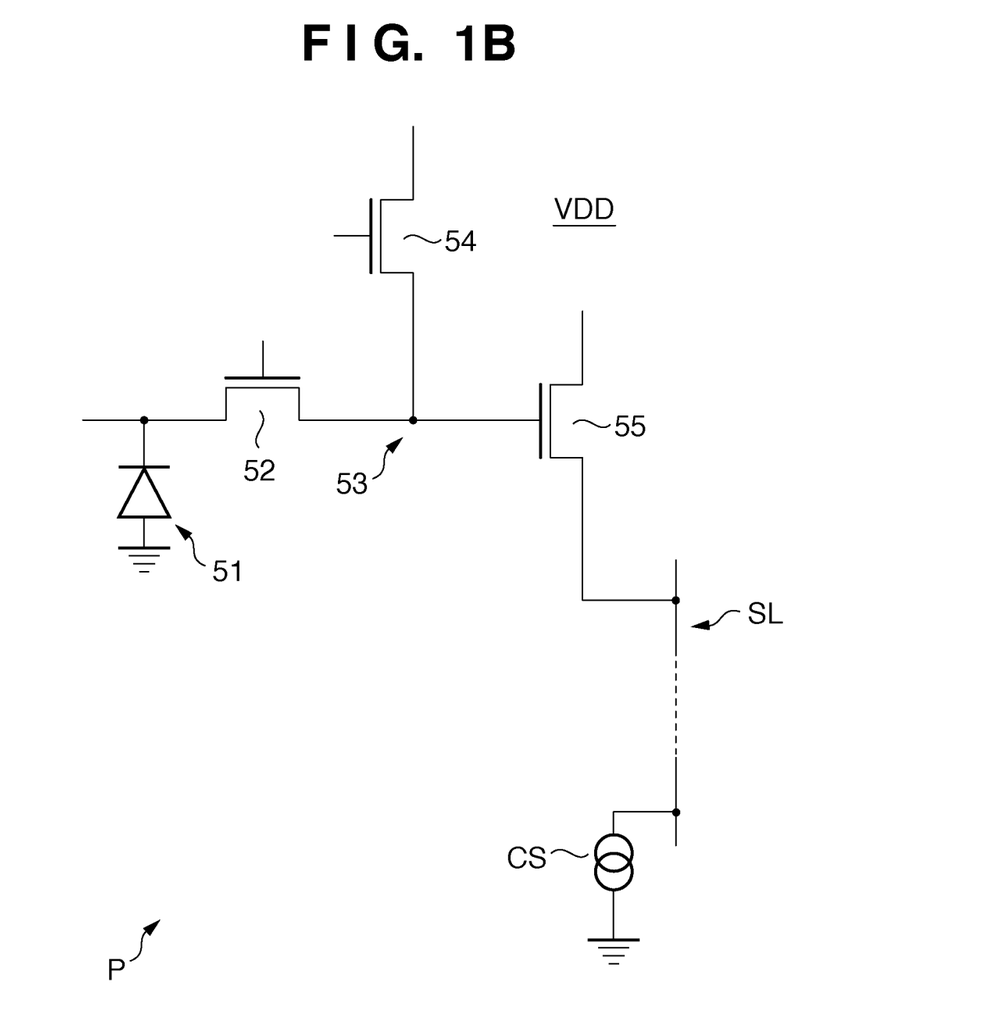
FIG. 1B is a circuit diagram for one pixel in a pixel array PA shown in FIG. 1A.
Figure 1C:
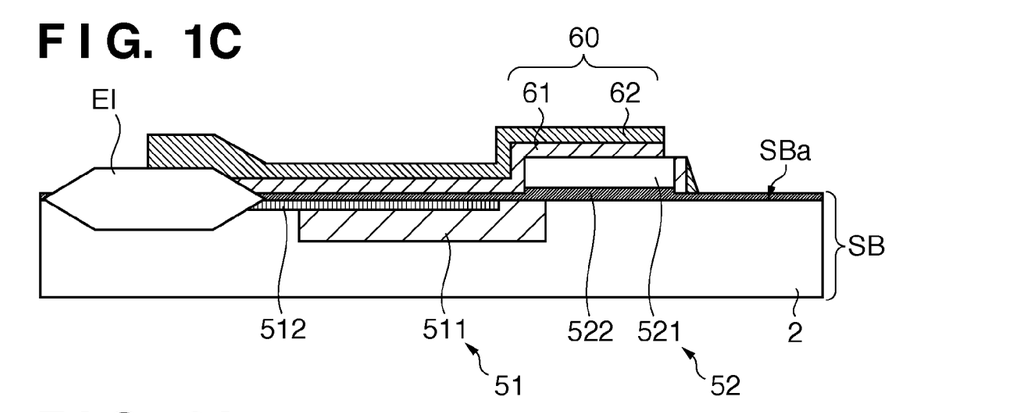
FIG. 1C is a cross-sectional view of the photodiode shown in FIG. 1B and a transfer MOS transistor.

The configuration of a solid-state image sensor to which the manufacturing method of the present invention is applied shall be described using FIGS. 1A to 1C.

FIG. 1A is a diagram illustrating the overall configuration of the solid-state image sensor.

A solid-state image sensor 1 includes a pixel array PA, a vertical scanning circuit 10, a holding circuit 20, a horizontal scanning circuit 30, and an output amplifier 40.

Multiple pixels P are arranged one- or two-dimensionally in the pixel array PA.

The vertical scanning circuit 10 is a circuit that selects a readout row in the pixel array PA from which signals are to be read out by scanning the pixel array PA in the vertical direction, and outputs the signals from the readout row to multiple signal lines SL.

The holding circuit 20 is a circuit that temporarily holds noise signals and optical signals outputted from the readout row via multiple signal lines in the column direction.

The horizontal scanning circuit 30 is a circuit that sequentially transfers the signals held in the holding circuit 20 to the output amplifier 40 by scanning the holding circuit 20 in the horizontal direction.

The output amplifier 40 generates an image signal based on the transferred signals. For example, the output amplifier generates an image signal by finding the difference between a noise signal and an optical signal. The output amplifier 40 outputs the generated image signal to a signal processing circuit in a later stage.

FIG. 1B is a circuit diagram of a single pixel P as shown in FIG. 1A.

The pixel P includes a photoelectric converting unit 51, a transfer unit 52, a charge-voltage conversion unit 53, a reset unit 54, and an output unit 55.

The photoelectric converting unit 51 produces a charge based on light and stores the charge. In the circuit structure shown in FIG. 1B, the charge carrier is electrons. The photoelectric converting unit 51 is, for example, a photodiode whose anode is connected to a ground potential and whose cathode is connected to the transfer unit 52.

The transfer unit 52 transfers the charge produced by the photoelectric converting unit 51 to the charge-voltage conversion unit 53. The transfer unit 52 is, for example, an N-type MOS transistor, and transfers the charge produced by the photoelectric converting unit 51 to the charge-voltage conversion unit 53 by turning on when an active-level transfer control signal is supplied from the vertical scanning circuit 10.

The charge-voltage conversion unit 53 converts the transferred charge into a voltage. The charge-voltage conversion unit 53 is, for example, an N-type floating diffusion.

The reset unit 54 resets the charge-voltage conversion unit 53 and places the pixel P in a selected or non-selected state based on a supplied reset potential. The reset unit 54 is, for example, an N-type MOS transistor, and resets the charge-voltage conversion unit 53 by turning on when an active-level reset control signal has been supplied from the vertical scanning circuit 10. The reset unit 54 puts the pixel into a selected state by the potential of the charge-voltage conversion unit 53 being reset to a first potential by a reset potential supplied to the drain. In addition, the reset unit 54 puts the pixel into a non-selected state by the potential of the charge-voltage conversion unit 53 being reset to a second potential by a reset potential supplied to the drain.

The output unit 55 outputs a signal based on the voltage of the charge-voltage conversion unit 53 to the signal line SL. The output unit 55 is, for example, an N-type MOS transistor, and along with a constant current source CS connected to the signal line SL, forms a source follower circuit. In other words, after outputting a noise signal to the signal line SL, the output unit 55 outputs, to the signal line SL, an optical signal based on the voltage of the charge-voltage conversion unit 53 in the state when the charge of the photoelectric converting unit 51 was transferred to the charge-voltage conversion unit 53 by the transfer unit 52.

Note that each pixel P may be configured so as to include a select transistor (not shown). In this case, a selection unit is inserted in series between an amplifying transistor and the signal line SL. The select transistor is, for example, an N-type MOS transistor, and places the pixel P in a selected or non-selected state by turning on in response to an active-level selection control signal from the vertical scanning circuit 10.

FIG. 1C is a cross-sectional view of the photoelectric converting unit and the transfer MOS transistor shown in FIG. 1B.

The photoelectric converting unit 51 is disposed in a semiconductor substrate SB. The semiconductor substrate SB is formed of, for example, silicon. The photoelectric converting unit 51 is isolated from an adjacent photoelectric converting unit (not shown) by an element isolation unit EI. The element isolation unit EI is formed of an insulator such as, for example, silicon oxide. The element isolation unit EI may have a LOCOS structure, or may have an STI structure. A well 2, which is a P-type semiconductor region, is disposed in the periphery of the photoelectric converting unit 51. The photoelectric converting unit 51 includes a charge storage region 511 and a surface region 512.

The charge storage region 511 is a semiconductor region that stores a charge, and contains an N-type impurity at a higher concentration than that of the P-type impurity in the well 2. The charge storage region 511 contains the N-type impurity at a concentration of, for example, $5 \times 10^{16}$ to $5 \times 10^{18}/cm^3$. The N-type impurity in the charge storage region 511 has, for example, arsenic, phosphorous, or the like as its primary component.

The surface region 512 is disposed upon the charge storage region 511 so as to prevent the charge storage region 511 from being exposed to the surface SBa of the semiconductor substrate SB and thus protect the charge storage region 511. The surface region 512 contains a P-type impurity at a higher concentration than that of the N-type impurity in the charge storage region 511 and at a higher concentration than that in the well 2. The surface region 512 contains the P-type impurity at a concentration of, for example, $5 \times 10^{17}$ to $5 \times 10^{19}/cm^3$. The P-type impurity in the surface region 512 has, for example, boron as its primary component. In order for the charge storage region 511 to store a sufficient charge at a desired depletion voltage, it is necessary to form the charge storage region at as shallow a position as possible within the substrate SB. Accordingly, it is also necessary to form the surface region only in a shallow position with respect to the surface and at a high concentration.

A gate electrode 521 in the transfer unit 52 is disposed upon the semiconductor substrate SB over an oxide film 522. The oxide film 522 is disposed so as to cover the surface SBa of the semiconductor substrate SB. The oxide film 522 is disposed between the semiconductor substrate SB and the gate electrode 521, and functions as a gate oxide film within the transfer unit 52. The gate electrode 521 is formed of, for example, polysilicon.

An antireflection film 60 is disposed so as to cover the semiconductor substrate SB and the gate electrode 521. The antireflection film 60 includes a nitride film 61 and an oxide film 62. The nitride film 61 is disposed so as to cover the semiconductor substrate SB and the gate electrode 521. The nitride film 61 is formed of, for example, silicon nitride. The oxide film 62, meanwhile, is formed so as to cover the nitride film 61. The oxide film 62 is formed of, for example, silicon oxide.

While the descriptions provided thus far have discussed a case where the charge stored in the charge storage region 511 is stored as electrons, the present invention is also applicable in the case where the charge is stored as holes. In such a case, all of the polarities of the transistors in the circuit shown in FIG. 1B are P-type. The power source connected to one end of the photodiode is VDD rather than a ground. Meanwhile, the power source connected to the drain ends of the reset transistor and the amplifying transistor is a ground. By reversing the polarities of the impurity regions in the cross-section shown in FIG. 1C, that cross-section can be applied as-is. The charge storage region 511 in FIG. 1C contains the P-type impurity at a concentration of, for example, $5\times10^{16}$ to $5\times10^{18}/cm^3$. The P-type impurity in the charge storage region 511 has, for example, boron as its primary component. The surface region 512 contains an N-type impurity at a higher concentration than that of the P-type impurity in the charge storage region 511 and at a higher concentration than that in the well 2. The surface region 512 contains the N-type impurity at a concentration of, for example, $5\times10^{17}$ to $5\times10^{19}/cm^3$. The N-type impurity in the surface region 512 has, for example, arsenic, phosphorous, or the like as its primary component. The same descriptions can be applied to all the other structures and operations discussed with respect to the case where electrons are stored.

First Embodiment

A manufacturing method according to the present invention shall be described using FIGS. 2A to 2H.

In the present embodiment, the charge storage region is assumed to be N-type.

Figure 2A:
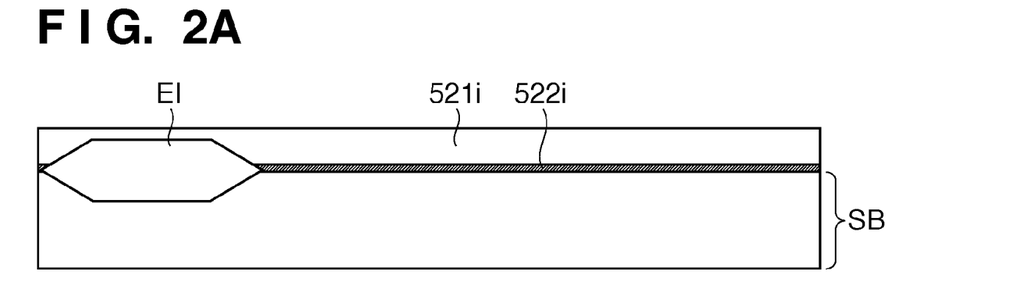
FIGS. 2A to 2H are diagrams illustrating manufacturing steps for the cross-section shown in FIG. 1C.

In the step illustrated in FIG. 2A, the element isolation unit EI and an oxide film 522i are formed upon the semiconductor substrate SB. The oxide film 522i is formed at a thickness of, for example, 50 to 150 Å. A polysilicon layer 521i is then formed upon the oxide film 522i.

Figures 2B, 2C:
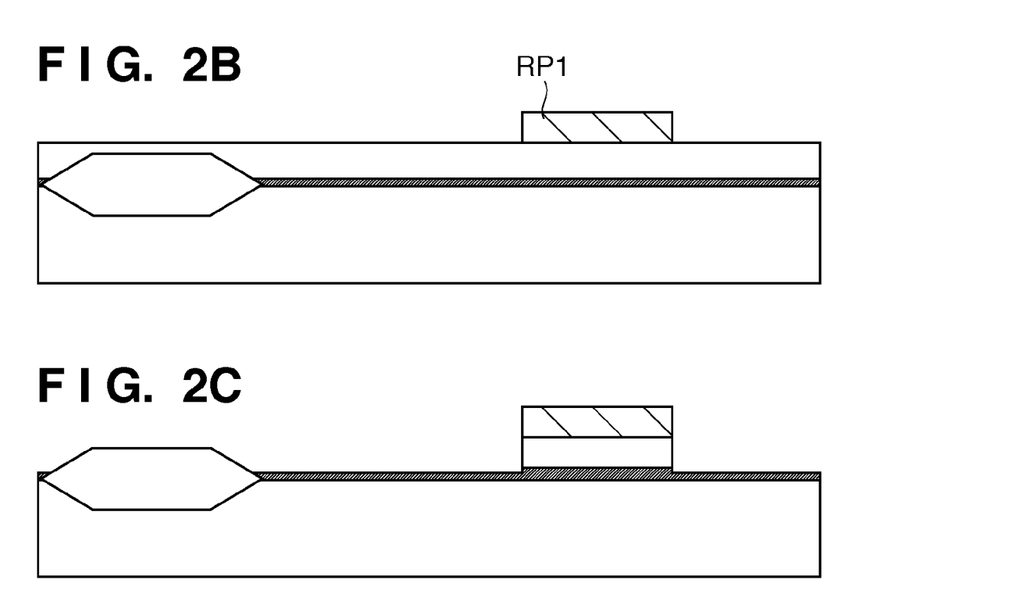

In the step illustrated in FIG. 2B, a resist pattern RP1 is formed so as to cover a position in which a gate electrode is to be formed.

In the step illustrated in FIG. 2C, the gate electrode 521 is formed by etching the polysilicon layer 521i using the resist pattern RP1 as a mask. Furthermore, the oxide film 522 is formed by etching part of the oxide film 522i (a portion extending to a predetermined depth from the surface) using the resist pattern RP1 as a mask.

Figure 2D:
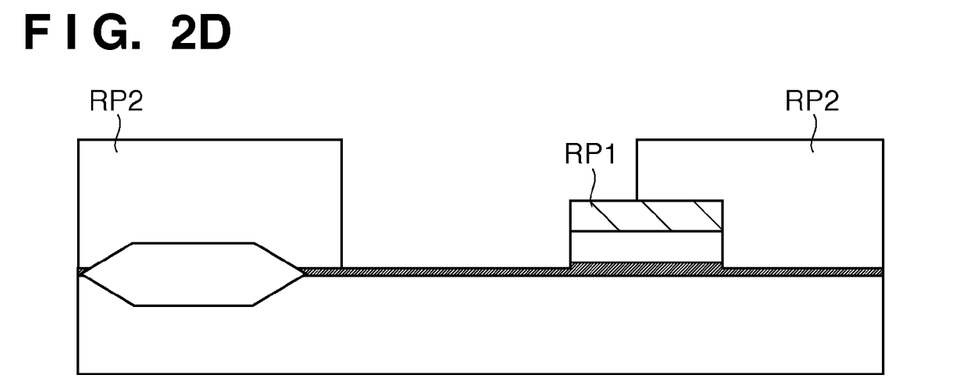

In the step illustrated in FIG. 2D, a resist pattern RP2 is formed exposing a region in which the photoelectric converting unit 51 is to be disposed.

Figure 2E:
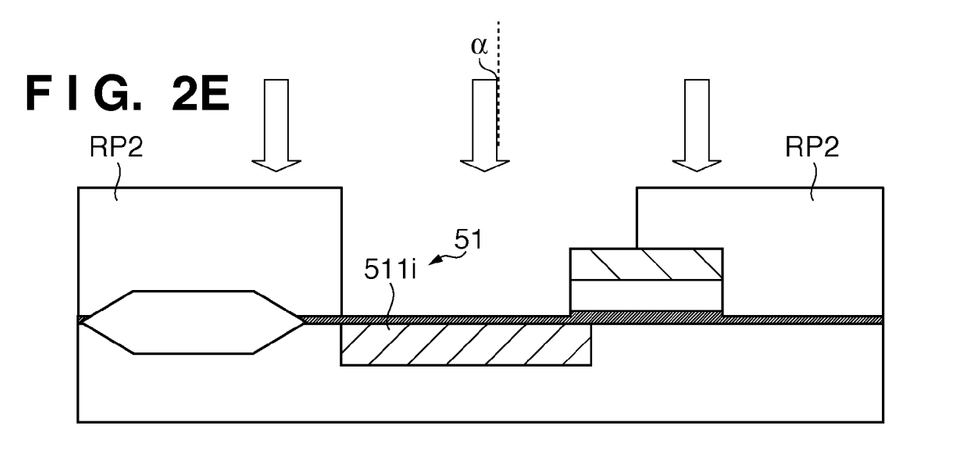

In the step illustrated in FIG. 2E, the semiconductor substrate SB is implanted with N-type impurity ions using the resist pattern RP2 as a mask, thereby forming a charge storage region 511i of the photoelectric converting unit 51. The N-type impurity in this step uses arsenic as its primary component.

The dose of the N-type impurity in this step is, for example, $5\times10^{11}$ to $5\times10^{13}/cm^2$. The acceleration energy of the N-type impurity in this step is, for example, 300 to 600 KeV. Finally, the angle of impurity implantation is, for example, an angle $\alpha$, approximately 0 degrees relative to the normal line of the semiconductor substrate.

Figure 2F:
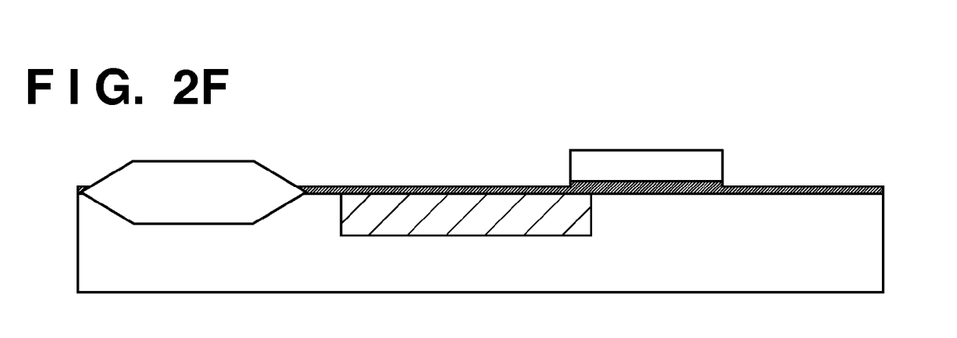

In the step illustrated in FIG. 2F, first, the resist pattern RP1 and resist pattern RP2 are removed.

Next, the semiconductor substrate SB is heated through RTA to a temperature of no less than 800° C. and no more than 1200° C. Through this, the atoms in the charge storage region 511i are rearranged so that defects in the charge storage region 511i are removed, thereby stabilizing the crystal sequence within the charge storage region 511i.

If the RTA heating temperature is less than 800° C., there is the possibility that defects will remain in the charge storage region. On the other hand, if the heating temperature exceeds 1200° C., the thermal diffusion of the N-type impurity within the charge storage region increases, making it impossible to obtain the desired density profile.

More specifically, the temperature of the semiconductor substrate SB is controlled by the RTA apparatus in the following manner. The temperature is raised from normal temperature to no less than 800° C. and no more than 1200° C. in no less than 1 second and no more than 60 seconds. The temperature of no less than 800° C. and no more than 1200° C. is then held for a time of no less than 10 seconds and no more than 300 seconds. After this, the temperature is reduced from the temperature of no less than 800° C. and no more than 1200° C. to 400° C. in no less than 1 second and no more than 30 seconds. Almost no ion diffusion occurs if the temperature drops to 400° C.

Figure 2G:
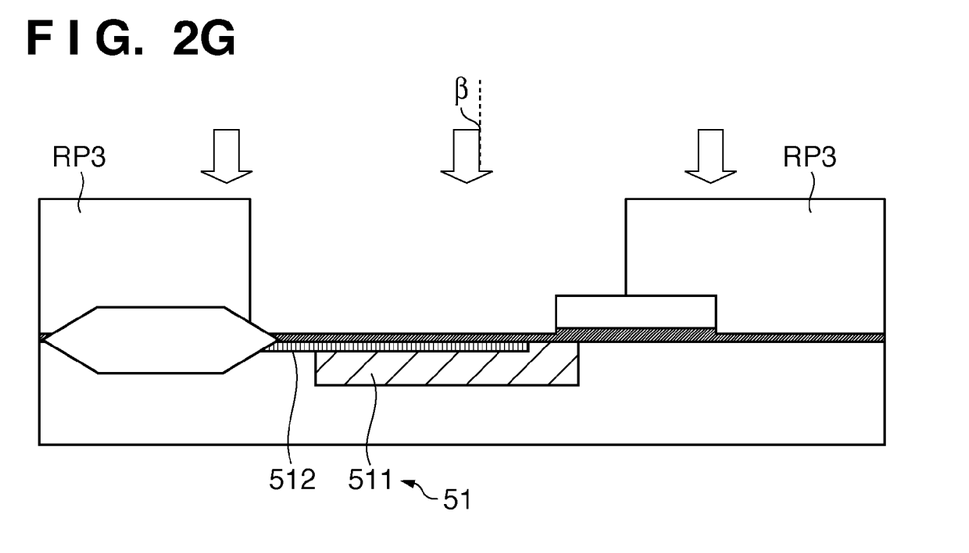

In the step illustrated in FIG. 2G, a resist pattern RP3 is formed exposing a region in which the photoelectric converting unit 51 is to be disposed. The semiconductor substrate SB is implanted with P-type impurity ions using the resist pattern RP3 as a mask, thereby forming the surface region 512 so as to be disposed upon the charge storage region 511 of the photoelectric converting unit 51. The P-type impurity in this step uses boron as its primary component. The dose of the P-type impurity in this step is greater than the dose of the N-type impurity shown in FIG. 2E. The acceleration energy of the P-type impurity is, for example, 5 to 100 KeV. The angle of the P-type impurity implantation is, for example, an angle $\beta$, approximately 0 degrees relative to the normal line of the semiconductor substrate. The resist pattern RP3 is then removed.

The dose of the P-type impurity is, for example, $5\times10^{12}$ to $5\times10^{14}/cm^2$. Based on examinations performed by the inventors, the occurrence of damage caused by implantation is particularly evident when the dose is approximately $5\times10^{12}/cm^2$ or more, and particularly when the dose is $10^{13}/cm^2$ or more. Although the damage is greater at higher acceleration energies, it is primarily determined by the dose. Based on this, more defects will occur in the surface region 512 than in the charge storage region 511.

Figure 2H:
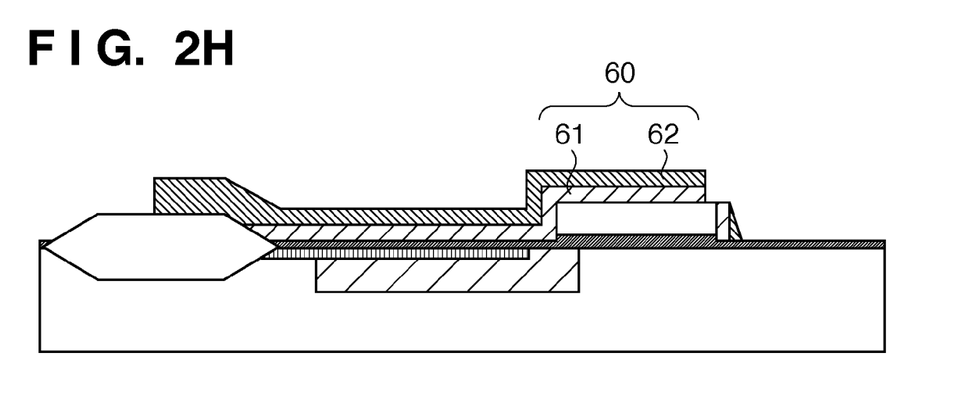

Meanwhile, the diffusion coefficient of the P-type impurity in the step illustrated in FIG. 2G (for example, boron) is greater than the diffusion coefficient of the N-type impurity in the step illustrated in FIG. 2H (for example, arsenic). The diffusion (TED) resulting from the damage caused by implantation has a higher influence with elements having a high diffusion coefficient (boron).

In the step illustrated in FIG. 2G, the semiconductor substrate SB is first heated through RTA to a temperature of no less than 800° C. and no more than 1200° C. Through this, the atoms in the surface region 512 are rearranged so that defects in the surface region 512 are removed, thereby stabilizing the crystal sequence within the surface region 512.

The reason why heating at temperatures below 800° C. and above 1200° C. is inappropriate are the same as those described in the post-charge storage region formation RTA step discussed above.

The specific conditions for this RTA step are as follows. The temperature is raised from normal temperature to no less than 800° C. and no more than 1200° C. in no less than 1 second and no more than 60 seconds. The temperature of no less than 800° C. and no more than 1200° C. is then held for a time of no less than 10 seconds and no more than 300 seconds. After this, the temperature is reduced from a temperature of no less than 800° C. and no more than 1200° C. to 400° C. in no less than 1 second and no more than 30 seconds. Almost no ion diffusion occurs if the temperature drops to 400° C.

Here, it is preferable for the temperature rise time and temperature drop time to be as short as possible in order to shorten the heating time at less than 800° C.; however, due to the capabilities of the RTA apparatus, it is difficult to reduce that time beyond one second. Meanwhile, if the temperature rise time and temperature drop time are each longer than 60 seconds, the heating time at less than 800° C. increases, leading to a marked occurrence of enhanced diffusion.

Furthermore, if the RTA heating hold time is less than 10 seconds, defects within the surface region 512 cannot be sufficiently removed, causing a marked occurrence of low-temperature enhanced diffusion in the later steps involving low-temperature heating. However, if the RTA heating hold time is more than 300 seconds, there is an increase in thermal diffusion of the P-type impurity within the surface region.

Next, the antireflection film 60 is formed so as to cover the semiconductor substrate SB, using a method that involves heating the semiconductor substrate SB at a temperature of less than 800° C. Specifically, the nitride film 61 is formed through CVD so as to cover the semiconductor substrate SB, while heating the semiconductor substrate SB at a temperature of no less than 700° C. and less than 800° C. The nitride film 61 is formed at a thickness that prevents the reflection of light at the border between the semiconductor substrate SB and the oxide film 62, such as, for example, 400 to 600 Å. Then, the oxide film 62 is formed through CVD so as to cover the nitride film 61, while heating the semiconductor substrate SB at a temperature of no less than 600° C. and less than 800° C. The oxide film 62 is formed at a thickness of, for example, 500 to 3000 Å.

As described thus far, the substrate is heated at no less than 800° C. and no more than 1200° C. through RTA after the ion implantation of the P-type and N-type impurities but before heat treatment at a temperature of less than 800° C. This reduces the occurrence of defects in the surface region caused by implantation prior to lengthy heat treatment at a temperature of less than 800° C., which makes it possible to suppress enhanced diffusion. A desired density profile can be obtained as a result of the implantation and diffusion. As a result, it is possible to sharpen the density profile of the charge storage region, thereby making it possible to balance sufficient saturation with low-voltage driving.

Dark current in the photodiode can be effectively reduced due to the recovery of crystal defects. Furthermore, because enhanced diffusion can be suppressed, the charge storage region/surface region border in the photoelectric converting unit and the border of the channel region in the charge storage region/transfer unit can easily be formed in the position dictated by the design. As a result, the load of the photodiode can be improved, and variance between depletion voltage wafers and between wafer surfaces can be reduced.

Second Embodiment

Next, a manufacturing method for a solid-state image sensor in the case where the charge is stored as holes shall be described using FIGS. 2A to 2H.

FIGS. 2A to 2D are exactly the same as the case of electrons and thus descriptions thereof shall be omitted.

In the step illustrated in FIG. 2E, the semiconductor substrate SB is implanted with P-type impurity ions using the resist pattern RP2 as a mask, thereby forming the charge storage region 511$i$ of the photoelectric converting unit 51. The P-type impurity in this step uses boron as its primary component. The dose of the P-type impurity is, for example, $5 \times 10^{11}$ to $5 \times 10^{13}/\text{cm}^2$. The acceleration energy of the P-type impurity is, for example, 50 to 150 KeV. The angle of the P-type impurity implantation is, for example, an angle α, approximately 0 degrees relative to the normal line of the semiconductor substrate.

The step illustrated in FIG. 2F includes the conditions of the RTA process, and is exactly the same as that of the first embodiment.

In the step illustrated in FIG. 2G, a resist pattern RP3 is formed exposing a region in which the photoelectric converting unit 51 is to be disposed. The semiconductor substrate SB is implanted with N-type impurity ions using the resist pattern RP3 as a mask, thereby forming the surface region 512 of the photoelectric converting unit 51. The N-type impurity in this step uses arsenic as its primary component. The dose of the N-type impurity is greater than the dose of the P-type impurity in the step illustrated in FIG. 2E. The acceleration energy of the N-type impurity is, for example, 50 to 100 KeV. The angle of the N-type impurity implantation is, for example, an angle β, approximately 0 degrees relative to the normal line of the semiconductor substrate. The resist pattern RP3 is then removed.

The dose of the N-type impurity is, for example, $5 \times 10^{12}$ to $5 \times 10^{14}/\text{cm}^2$. Based on examinations performed by the inventors, the occurrence of damage (defects) caused by implantation is particularly evident when the dose is approximately $5 \times 10^{12}/\text{cm}^2$ or more, and particularly when the dose is $10^{13}/\text{cm}^2$ or more. Although the damage is greater at higher acceleration energies, it is primarily determined by the dose. Based on this, the occurrence of crystal defects caused by implantation is more marked in the surface region 512 than in the charge storage region 511.

The diffusion coefficient of the P-type impurity (for example, boron) in the step illustrated in FIG. 2E is greater than the diffusion coefficient of the N-type impurity (for example, arsenic) in the step illustrated in FIG. 2G. Enhanced diffusion resulting from damage is particularly evident with elements having a high diffusion coefficient (boron).

The RTA heating conditions of the step illustrated in FIG. 2F can be called the same as the post-charge storage region 511 formation RTA described above, and thus descriptions thereof shall be omitted. The method for forming the antireflection film is the same as in the first embodiment.

As described thus far, the substrate is heated at no less than 800° C. and no more than 1200° C. through RTA after the ion implantation of the P-type and N-type impurities but before heat treatment at a low temperature (less than 800° C.). This enables the reduction of the occurrence of defects in the surface region caused by implantation prior to lengthy heat treatment at a temperature of less than 800° C., which makes it possible to suppress enhanced diffusion; thus the desired density profile can be obtained as a result of the implantation and diffusion. As a result, it is possible to sharpen the density profile of the charge storage region, thereby making it possible to balance the saturation load with low-voltage driving.

Dark current in the photodiode can be reduced through the effective recovery of crystal defects in the surface region 512. Furthermore, because enhanced diffusion can be suppressed, the charge storage region/surface region border in the photoelectric converting unit and the border of the channel region in the charge storage region/transfer unit can easily be formed in the position dictated by the design. As a result, the saturation load of the photodiode can be improved, and variance between depletion voltage wafers and between wafer surfaces can be reduced.

Third Embodiment

Figure 3:
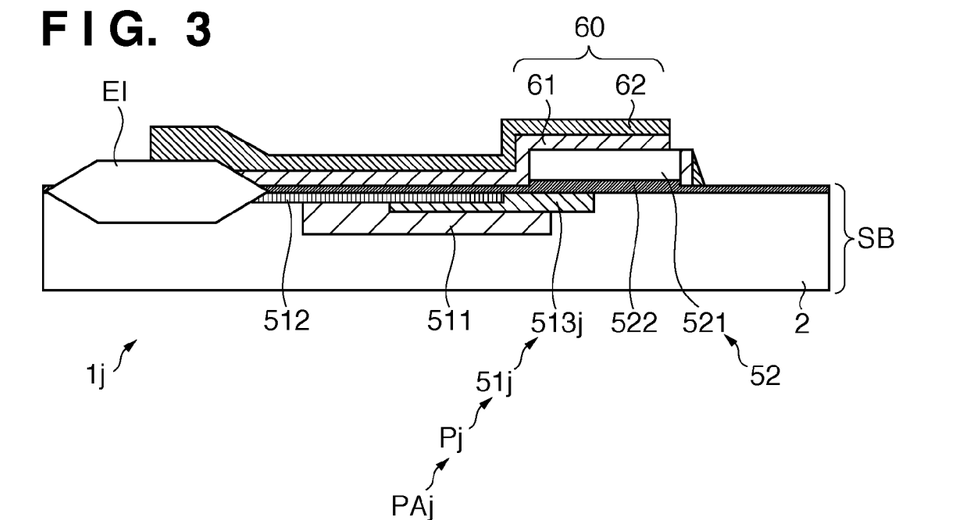
FIG. 3 is a cross-sectional view of a different embodiment of the photodiode and transfer MOS transistor shown in FIG. 1B.

A different cross-sectional structure of a photodiode to which the manufacturing method of the present invention can be applied is illustrated in FIG. 3.

The following descriptions shall focus upon the differences with the first embodiment.

A photoelectric conversion apparatus 1j includes a pixel array PAj. Each pixel Pj within the pixel array PAj includes a photoelectric converting unit 51j. The photoelectric converting unit 51j further includes a transfer region 513j. The transfer region 513j is disposed laterally to the surface region 512. The transfer region 513j extends from between the charge storage region 511 and the surface region 512 toward the charge-voltage conversion unit 53. Accordingly, when the transfer transistor 52 is turned on, the charge stored in the charge storage region 511 can be easily transferred to the charge-voltage conversion unit 53. In other words, the efficiency of the charge transfer from the photoelectric converting unit 51j to the charge-voltage conversion unit 53 can be improved.

Figure 4A:
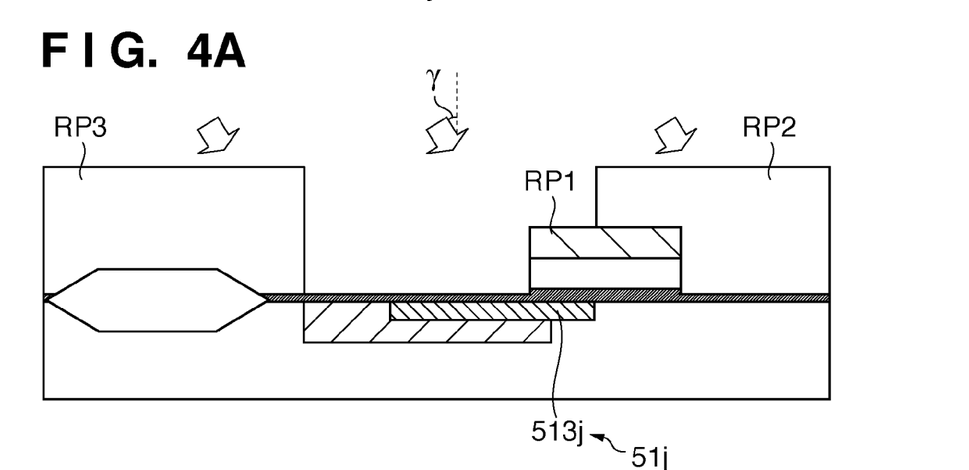
FIGS. 4A and 4B are diagrams illustrating manufacturing steps for the cross-section shown in FIG. 3.
Figure 4B:
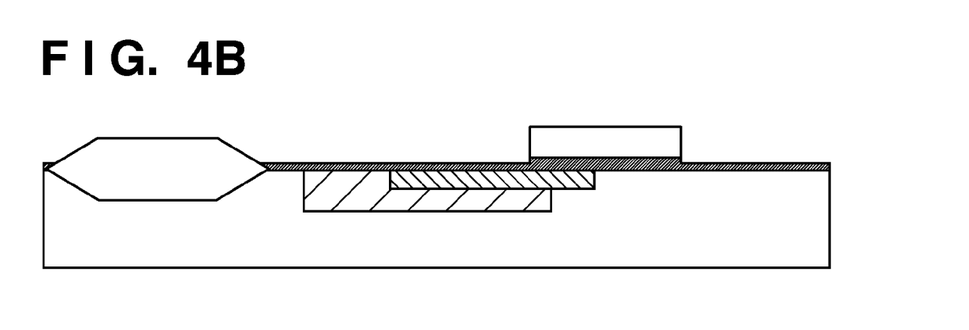

FIGS. 4A and 4B are diagrams illustrating a manufacturing method of the photoelectric conversion apparatus 1j. This method differs from the first embodiment in the following points. The step illustrated in FIG. 4A is performed following the steps illustrated in FIGS. 2A to 2E of the first embodiment. In the step illustrated in FIG. 4A, the semiconductor substrate SB is implanted with N-type impurity ions using the resist pattern RP2 as a mask, thereby forming the transfer region 513j so as to be disposed laterally to the surface region 512 in the photoelectric converting unit 51j. The N-type impurity in this step uses, for example, arsenic as its primary component. The acceleration energy of the N-type impurity ion implantation is, for example, 100 to 500 KeV. In this step, the semiconductor substrate SB is implanted with the N-type impurity ions at an implantation angle relative to the normal line of the semiconductor substrate SB that is greater than the angle used in the step illustrated in FIG. 2E. The angle of ion implantation is, for example, an angle γ (>α) relative to the normal line of the semiconductor substrate.

Forming the charge transfer region through two stages of implantation as in the present embodiment makes it possible to realize transfer at low voltages and sufficient saturation loads with ease.

In the step illustrated in FIG. 4B, first, the resist pattern RP1 and resist pattern RP2 are removed. After the resist pattern RP1 and resist pattern RP2 have been removed, the semiconductor substrate SB is heated through RTA at no less than 800° C. and no more than 1200° C. Through this, the atoms in the charge storage region 511 are rearranged so that defects in the charge storage region 511 and the transfer region 513j are removed, thereby stabilizing the charge storage region 511 and the transfer region 513j. This makes it possible to achieve a sharp density profile even in the shallow transfer region 513j.

After the step illustrated in FIG. 4B has been performed, the same steps as those illustrated in FIGS. 2G and 2H of the first embodiment are performed.

Thus the present invention is also applicable in a manufacturing method where the charge is stored as holes. Specifically, the P and N types in the structure shown in FIG. 3 can simply be swapped. The difference in the manufacturing methods is the conductivity type of the impurity ions that are implanted.

The step illustrated in FIG. 4A is performed following the step illustrated in FIG. 2E of the second embodiment. In the step illustrated in FIG. 4A, the semiconductor substrate SB is implanted with P-type impurity ions using the resist pattern RP2 as a mask, thereby forming the transfer region 513j so as to be disposed laterally to the surface region 512 in the photoelectric converting unit 51j. The P-type impurity uses, for example, boron fluoride as its primary component. The acceleration energy of the P-type impurity is, for example, 100 to 300 KeV. Boron or boron fluoride can be used as the ions to be implanted using an ion implantation device.

The implantation is carried out at an angle relative to the normal line of the semiconductor substrate SB that is greater than that in the step illustrated in FIG. 2E.

In the step illustrated in FIG. 4B, first, the resist pattern RP1 and resist pattern RP2 are removed. After the resist pattern RP1 and resist pattern RP2 have been removed, the semiconductor substrate SB is heated through RTA at no less than 800° C. and no more than 1200° C. Through this, the atoms in the charge storage region 511 are rearranged so that defects in the charge storage region 511 and the transfer region 513j are removed, thereby stabilizing the charge storage region 511 and the transfer region 513j. This makes it possible to achieve a sharp density profile even in the shallow transfer region 513j.

After the step illustrated in FIG. 4B has been performed, the same steps as those illustrated in FIGS. 2G and 2H of the second embodiment are performed.

The present embodiment makes it possible to transfer charges at even lower voltages.

Fourth Embodiment

Figure 5A:
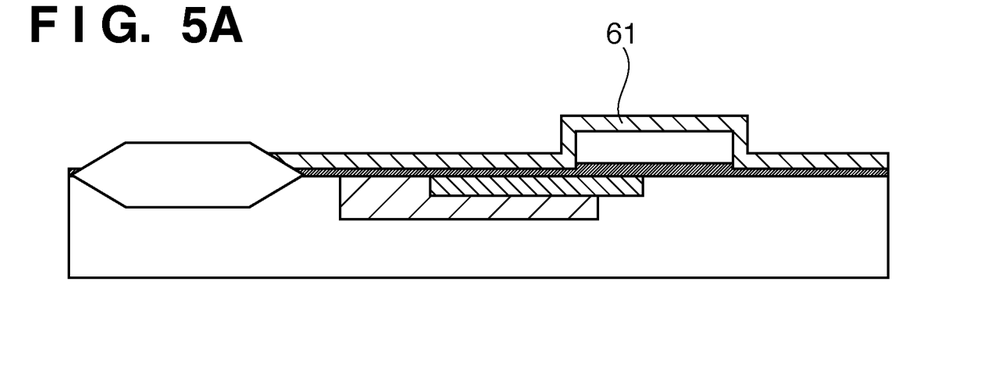
FIGS. 5A to 5C are diagrams illustrating different manufacturing steps for the cross-section shown in FIG. 3.
Figure 5B:
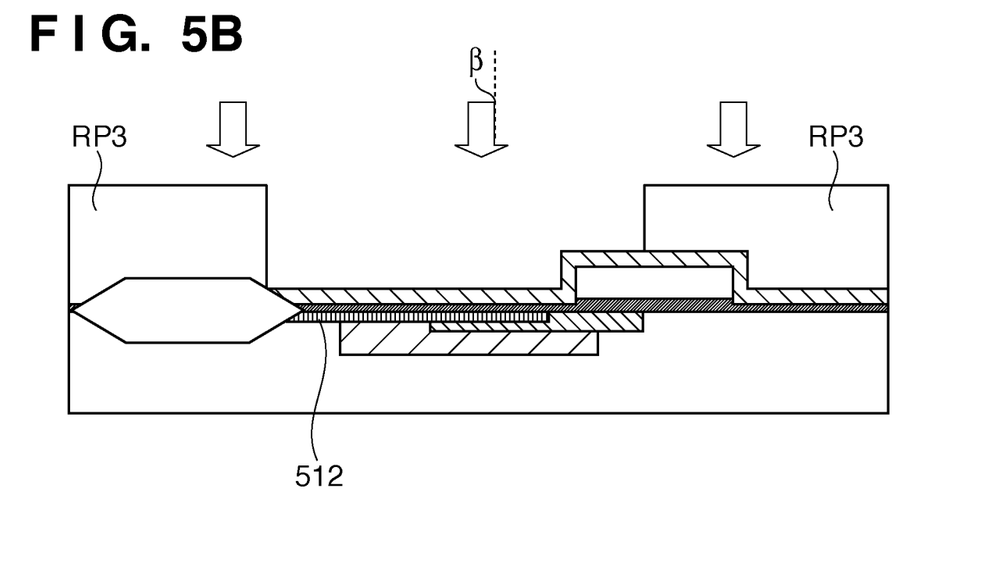
Figure 5C:
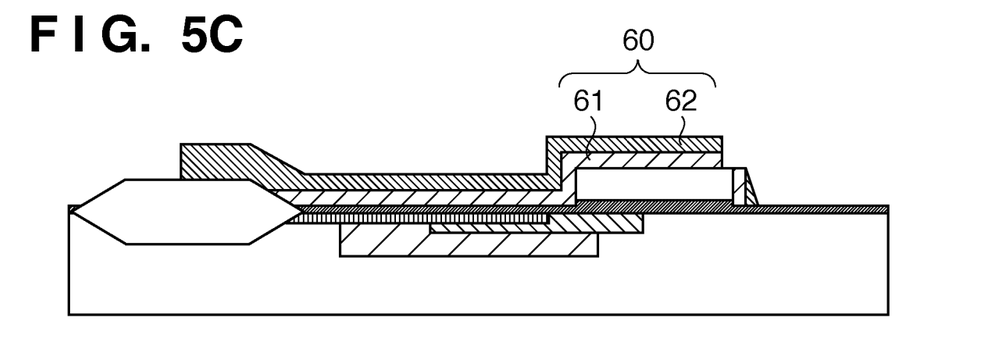

FIGS. 5A to 5C are diagrams illustrating a different manufacturing method for the cross-section shown in FIG. 3.

The step illustrated in FIG. 5A is performed as the step following that of FIG. 4B.

In the step illustrated in FIG. 5A, the nitride film 61 is formed through CVD so as to cover the semiconductor substrate SB, using a method that involves heating the semiconductor substrate SB at less than 800° C., while heating the semiconductor substrate SB at a temperature of no less than 700° C. and less than 800° C. The nitride film 61 is formed at a thickness that prevents the reflection of light at the border between the semiconductor substrate SB and the oxide film 62, such as, for example, 400 to 600 Å.

In the step illustrated in FIG. 5B, a resist pattern RP3 is formed exposing a region in which the photoelectric converting unit 51j is to be disposed. The semiconductor substrate SB is implanted with P-type impurity ions using the resist pattern RP3 as a mask, thereby forming the surface region 512 so as to be disposed upon the charge storage region 511 of the photoelectric converting unit 51j. The same ranges as those described in the third embodiment are applied to the ion types, doses, acceleration voltages, and implantation angles of this P-type impurity ion implantation.

In the step illustrated in FIG. 5C, the semiconductor substrate SB is first heated through RTA to a temperature of no less than 800° C. and no more than 1200° C. Through this, the atoms in the surface region 512 are rearranged so that defects in the surface region 512 are removed, thereby stabilizing the surface region 512.

Then, the oxide film 62 is formed through CVD so as to cover the nitride film 61, while heating the semiconductor substrate SB at a temperature of no less than 600° C. and less than 800° C., using a method that involves heating the semiconductor substrate SB at a temperature of less than 800° C. The oxide film 62 is formed at a thickness of, for example, 500 to 3000 Å.

It is also possible to swap all the P and N conductivity types of the impurity ions and semiconductor in the configurations illustrated in FIGS. 5A to 5C. The specific RTA conditions can be called the same as the descriptions in the aforementioned embodiments, and thus descriptions thereof shall be omitted.

While the present invention has been described with reference to an exemplary embodiment, it is to be understood that the invention is not limited to the disclosed exemplary embodiment. The scope of the following claims is to be accorded the broadest interpretation so as to encompass all such modifications and equivalent structures and functions.

This application claims the benefit of Japanese Patent Application No. 2009-026697, filed Feb. 6, 2009, Japanese Patent Application No. 2009-026703 filed Feb. 6, 2009 and Japanese Patent Application No. 2010-011372 filed on Jan. 21, 2010, which are hereby incorporated by reference herein in their entirety.

What is claimed is:

1. A method for manufacturing a solid-state image sensor, the method comprising:
   a first forming step of forming a charge storage region of a photoelectric converting unit by implanting a semiconductor substrate with ions of an impurity of a first conductivity type;
   a first heating step of heating the semiconductor substrate at a temperature of no less than 800° C. and no more than 1200° C. through rapid thermal annealing, after said first forming step;
   a second forming step of forming a surface region of the photoelectric converting unit by implanting the semiconductor substrate with ions of an impurity of a second conductivity type after said first heating step;
   a second heating step of heating the semiconductor substrate at a temperature of no less than 800° C. and no more than 1200° C. through rapid thermal annealing, after said second forming step; and
   a third forming step of forming an antireflection film that covers the photoelectric converting unit at a temperature of less than 800° C., after said second heating step, wherein enhanced diffusion is suppressed by said first and second heating steps being performed before said third forming step.

2. The method according to claim 1, wherein, in said first heating step and said second heating step, the temperature of the semiconductor substrate is controlled so that the temperature rises from normal temperature to no less than 800° C. and no more than 1200° C. within 60 seconds, is held at the temperature of no less than 800° C. and no more than 1200° C., and then drops from the temperature of no less than 800° C. and no more than 1200° C. to a temperature of 400° C. within 30 seconds.

3. The method according to claim 2, wherein, in said first heating step and said second heating step, the temperature of the semiconductor substrate is controlled so that the temperature of no less than 800° C. and no more than 1200° C. is held for no less than 10 seconds and no more than 300 seconds.

4. The method according to claim 1, wherein said third forming step includes the steps of:
   forming a nitride film through CVD so as to cover the semiconductor substrate; and
   forming an oxide film through CVD so as to cover the nitride film.

5. The method according to claim 1, wherein the dose of the impurity of the second conductivity type in said second forming step is greater than the dose of the impurity of the first conductivity type in said first forming step.

6. The method according to claim 1, further comprising a fourth forming step of forming a transfer region so as to be disposed laterally to the surface region in the photoelectric converting unit by implanting the semiconductor substrate with ions of an impurity of the first conductivity type, prior to performing said first heating step.

7. The method according to claim 6, wherein, in said fourth forming step, the ions of the impurity of the first conductivity type are implanted in the semiconductor substrate at an implantation angle relative to the normal line of the semiconductor substrate that is greater than the angle in said first forming step or the angle in said second forming step.

* * * * *